(12) United States Patent
Moriizumi et al.

(10) Patent No.: US 6,717,262 B1
(45) Date of Patent: Apr. 6, 2004

(54) MOUNTED CIRCUIT SUBSTRATE AND METHOD FOR FABRICATING THE SAME FOR SURFACE LAYER PADS THAT CAN WITHSTAND PAD EROSION BY MOLTEN SOLDER APPLIED OVER A PLURALITY OF TIMES

(75) Inventors: Kiyokazu Moriizumi, Kawasaki (JP); Manabu Watanabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/705,897

(22) Filed: Nov. 6, 2000

(30) Foreign Application Priority Data

Feb. 8, 2000 (JP) .......................................... 2000-029927

(51) Int. Cl.⁷ ............................................... H01L 23/48
(52) U.S. Cl. ........................ 257/737; 257/774; 257/784; 257/786; 257/766
(58) Field of Search ................................ 257/774, 784, 257/786, 738, 737

(56) References Cited

U.S. PATENT DOCUMENTS

| 4,949,219 | A | * | 8/1990 | Moriizumi et al. | ......... 361/386 |
|---|---|---|---|---|---|
| 5,378,310 | A | | 1/1995 | Satoh et al. | |
| 5,415,920 | A | | 5/1995 | Satoh et al. | |
| 5,445,994 | A | * | 8/1995 | Gilton | ........................ 437/183 |
| 5,585,673 | A | * | 12/1996 | Joshi et al. | ................... 257/751 |
| 5,851,915 | A | * | 12/1998 | Miyakawa | ................... 438/622 |
| 6,030,855 | A | * | 2/2000 | Bertin et al. | ................. 438/109 |
| 6,245,594 | B1 | * | 6/2001 | Wu et al. | .................. 438/108 |
| 6,259,161 | B1 | * | 7/2001 | Wu et al. | ..................... 257/766 |
| 6,415,974 | B2 | * | 7/2002 | Jao | ............................. 228/215 |
| 6,452,270 | B1 | * | 9/2002 | Huang | ......................... 257/738 |

FOREIGN PATENT DOCUMENTS

| JP | 63-62240 | 3/1988 |
|---|---|---|
| JP | 5-13933 | 1/1993 |
| JP | 5-129760 | 5/1993 |
| JP | 9-92964 | 4/1997 |
| JP | 9-219588 | 8/1997 |

OTHER PUBLICATIONS

US 5,284,696, 2/1994, Satoh et al. (withdrawn)

* cited by examiner

Primary Examiner—Cathy Lam
(74) Attorney, Agent, or Firm—Westerman, Hattori, Daniels & Adrian, LLP

(57) ABSTRACT

A mounted circuit substrate has at least one conductive layer. The side faces of a component mounting pad is formed on a surface of the substrate, and includes at least a columnar pattern made of a metal highly resistant to erosion by solder The side faces of the component mounting pad are completely covered with an organic insulating layer. Therefore, the component mounting pad can withstand molten solder stresses accompanying component replacement even when component replacement is done many times.

10 Claims, 9 Drawing Sheets

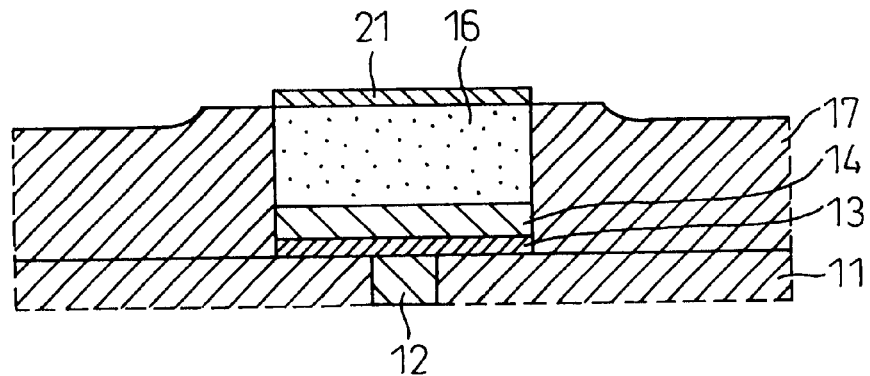
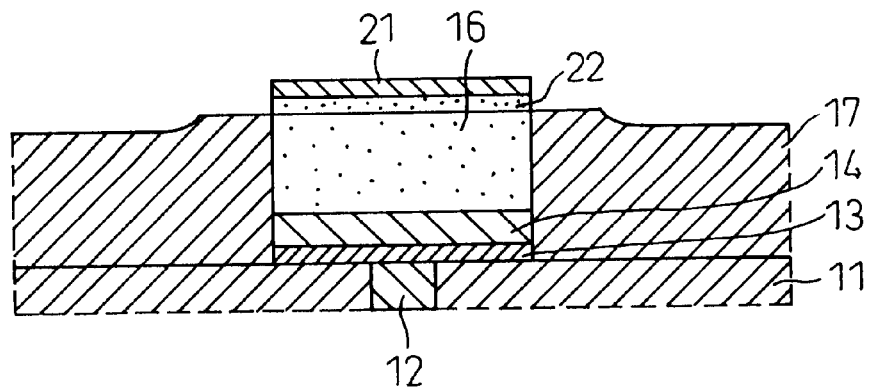

MOUNTED CIRCUIT SUBSTRATE AND METHOD FOR FABRICATING THE SAME FOR SURFACE LAYER PADS THAT CAN WITHSTAND PAD EROSION BY MOLTEN SOLDER APPLIED OVER A PLURALITY OF TIMES

BACKGROUND OF THE INVENTION

1. Field of the Invention

The present invention relates to a mounted circuit substrate and a method for fabricating the same; and more particularly, the invention relates to a mounted circuit substrate characterized by the structure of and the fabrication method for surface layer pads that can withstand pad erosion by molten solder applied over a plurality of times for component replacement on an MCM substrate to which functional components such as LSIs, capacitors, and resistors are mounted by soldering, and also relates to a method for fabricating such a mounted circuit substrate.

2. Description of the Related Art

Recently, thin-film interconnect substrates generally known as MCM (Multi-Chip Module) substrates, which can provide high density interconnections, have been commercially implemented and used in electronic apparatuses such as computers.

With such MCM substrates, since polyimide capable of forming a very thin dielectric film by spin coating is usually used as dielectric material, and since signal patterns are formed by means of sputtering and etching techniques using high-sensitivity resist, high-density patterns never attainable with ordinary printed wiring boards can be achieved.

MCM called MCM-D (Deposit) or MCM-C/D (Cofire/Deposit) is fabricated by forming thin-film circuits in multiple layers by deposition, more specifically, by vacuum deposition process, on a single ceramic substrate or a ceramic circuit within which a thick-film circuit is formed, and many products have been developed and commercialized by various companies.

Between them, MCM-C/D offers significant performance advantages since multi-terminal mounting can be achieved by mounting functional components such as LSIs on one side and input/output terminals on the reverse side, and since, electrically, interconnect paths can be made shorter.

In this case, functional components such as LSIs are mounted by soldering to component mounting pads formed on the surface layer of the MCM substrate; in particular, in the case of LSIs, C4 interconnection (Controlled Collapsed Chip Connection.) is employed in which solder bumps are formed on the terminals and LSIs are mounted face down on the MCM substrate.

However, as the number of chips mounted on an MCM substrate increases, the need to replace components, either to repair the components due to C4 interconnection failures or to upgrade LSI functions, is increasing, and more and more stringent demands are being placed on component rework techniques so that component replacement can be accomplished reliably a plurality of times on the same MCM substrate.

That is, component rework techniques are becoming important for component replacement that becomes necessary for such reasons as component failures at test or in use, design changes due to the discovery of bugs in LSIs, or functional upgrades of the LSIs built in the apparatus used.

For example, when mounting a bare-chip component, the chip by itself can be tested for functions after burn-in, but when it is mounted on an MCM, its functional compatibility with other functional component chips must also be considered; therefore, if there is a fault in inter-chip transfer timing, the component must be replaced.

In the component rework process, when remounting a solder-joined component such as a C4-joined one, first the defective or old component mounted on the MCM is removed by melting the solder, and then the new or upgraded component is remounted by melting the solder bumps.

The prior art and its associated problem will be described in detail later with reference to accompanying drawings.

SUMMARY OF THE INVENTION

An object of the present invention is to provide a component mounting pad that can withstand molten solder stresses accompanying component replacement even when component replacement is done many times.

According to the present invention, there is provided a mounted circuit substrate having at least one conductive layer, wherein side faces of a component mounting pad formed on a surface of the substrate, and including at least a columnar pattern made of a metal highly resistant to erosion by solder, are completely covered with an organic insulating layer.

A portion forming the component mounting pad and lying below the columnar pattern may be made larger in diameter than the columnar pattern. An Au layer is formed to cover an exposed top surface of the columnar pattern. The Au layer may be formed as an Au plated layer. The Au layer may be formed as an Au layer deposited by sputtering. The mounted circuit substrate may further comprise a plated layer made of a metal highly resistant to erosion by solder which is formed between the Au layer and the top surface of the columnar pattern.

The metal highly resistant to erosion by solder may be Ni or Pt. A portion forming the component mounting pad and lying below the columnar pattern may include at least a Cu base layer. The organic insulating layer may be formed from a polyimide resin. All top surfaces of the columnar patterns may lie in the same plane.

Further, according to the present invention, there is also provided a method for fabricating a mounted circuit substrate, wherein after a component mounting pad including at least a columnar pattern made of a metal highly resistant to erosion by solder is formed on a thin-film multilayer substrate having at least one, conductive layer, an organic insulating layer is formed in such a manner as to cover the component mounting pad, and then the organic insulating layer is removed over entire surface thereof so as to provide a planarized surface until a top of the columnar pattern is exposed.

After forming the columnar pattern, the portion forming the component mounting pad and lying below the columnar pattern may be etched so as to have a larger diameter than a diameter of the columnar pattern, thereby forming the component mounting pad. The step of removing the organic insulting layer over the entire surface thereof may be performed using a method called Chemical Mechanical Polishing method. An Au layer may be formed by electroless plating on the exposed top surface of the columnar pattern or by sputtering on the exposed top surface of the columnar pattern. After a plated layer made of the metal highly resistant to erosion by solder may be formed by electroless plating, an Au layer may be formed either by electroless plating or by sputtering on the exposed top surface of the columnar pattern.

The metal highly resistant to erosion by solder may be Ni or Pt. The portion forming the component mounting pad and lying below the columnar pattern may include at least a Cu base layer. The organic insulating layer may be formed from a polyimide resin. Prior to the formation of the organic insulating layer, at least a coupling agent may be applied to the side faces of the columnar pattern.

BRIEF DESCRIPTION OF THE DRAWINGS

The present invention will be more clearly understood from the description of the preferred embodiments as set forth below with reference to the accompanying drawings, wherein:

FIG. 9 is a schematic cross-sectional view showing third embodiment of the resent invention;

FIG. 10 is a schematic cross-sectional view showing a modified example of the third embodiment of the present invention;

DESCRIPTION OF THE PREFERRED EMBODIMENTS

Before describing in detail the preferred embodiments according to the present invention, a prior art technique and the problem associated with the prior art will be described with reference to FIGS. 1 to 5.

Figure 1A:
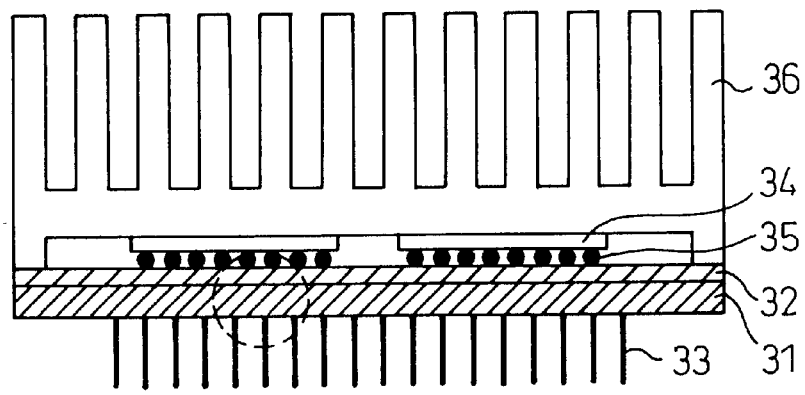
FIGS. 1A and 1B are schematic cross-sectional views of MCM-C/D according to the prior art.
Figure 1B:
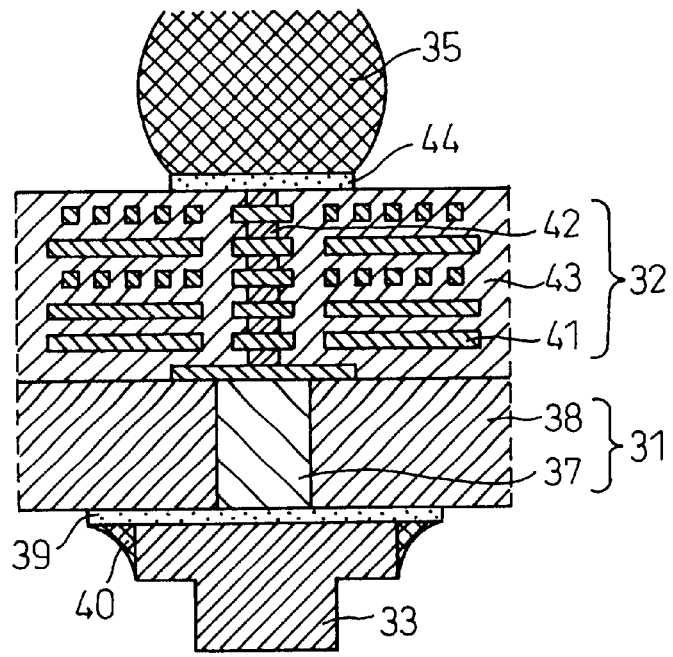

FIGS. 1A and 1B are schematic cross-sectional views of MCM-C/D according to the prior art.

As shown in FIG. 1A, the MCM-C/D comprises a thin-film multilayer interconnect substrate C part 31 formed by cofiring and a thin-film multilayer interconnect substrate D part 32 formed by the subsequent vacuum deposition process, and input/output pins 33 are provided on one surface of the thin-film multilayer interconnect substrate C part 31 for the transfer of signals to and from the outside world and for the supply of power.

On the other hand, on the thin-film multilayer interconnect substrate D part 32 is mounted an LSI chip 34 "flipped" top-side down, by means of solder bumps 35 made of Pb-Sn or the like, and cooling fins 36 are mounted on the reverse side of the LSI chip 34 to dissipate the heat generated in the LSI.

FIG. 1B is a schematic cross-sectional view showing in enlarged form the portion encircled by a dashed circle in FIG. 1A. The thin-film multilayer interconnect substrate C part 31 has the structure such that a W via 37 plated with tungsten (W) and passing through the ceramic substrate 38 is formed simultaneously during the firing of ceramics and embedded in the ceramic substrate 38. On one side of the embedded W via 37 is provided a connection pad 39 formed by W—Ni plating or from Cr—Cu—Ni—Au or the like, and an input/output pin 33 formed, for example, from Kovar is connected to it by solder 40.

On the other side of the embedded W via 37 is connected a Cu pattern forming the lowermost Cu interconnect layer 41, on top of which Cu interconnect layers 41 and polyimide layers 43 are deposited one on top of another to construct the thin-film multilayer interconnect substrate D part 32.

The Cu interconnect layers 41 at different levels are interconnected by a Cu via 42; in the diagram, for convenience the Cu via 42 is shown as being formed through the center for interconnection, though the actual connection site differs from level to level when viewed from the top.

A component mounting pad 44 is formed by plating or the like in such a manner as to be connected to the uppermost Cu via 42, and the LSI chip 34 is mounted by melting the solder bump 35 on the LSI chip 34 and connecting it to the pad 44.

Figure 2:
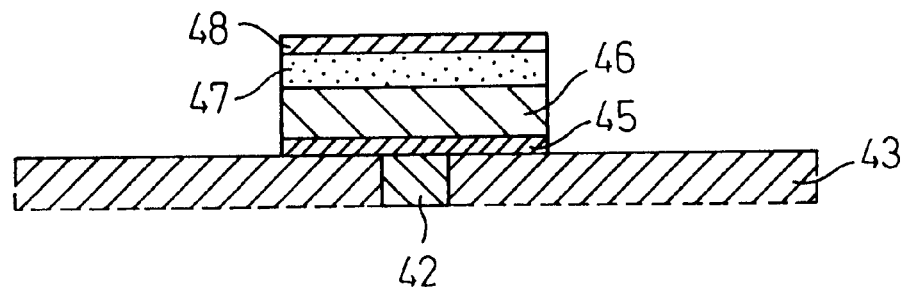
FIG. 2 is a schematic cross-sectional view of a pad according to the prior art.

FIG. 2 is a schematic cross-sectional view showing the component mounting pad according to the prior art. As shown, a Cr thin film 45 with good adhesion to the polyimide layer 43 is formed up to a thickness of about 1000 Å in such a manner as to be connected to the uppermost Cu via 42 exposed in the polyimide layer 43, after which a Cu electroplated layer 46 as a main conductor having a thickness of 1 μm to 5 μm, for example, 3 μm, a Ni electroplated layer 47 highly resistant to erosion by solder and a thickness of 1 μm to 3 μm, for example, 2 μm, and an Au electroplated layer 48 for preventing the oxidation of the underlying Ni electroplated layer 47 while providing solder wettability, are formed in a multiple layer structure on top of the Cr thin film 45 to complete the formation of the component mounting pad.

Here, the uppermost Au electroplated layer 48 is diffused into the solder during the joining with the solder pad 35 and, therefore, the presence of the Au electroplated layer 48 cannot be confirmed after the joining.

However, in a rework process necessitated by the need to replace the component, the pad 44 formed on the MCM substrate is exposed to molten solder twice, first in the component removal step and then in the remounting step, excluding the initial mounting step. This causes the problem that the Cu electroplated layer 46 used as the main conductor gradually dissolves into the molten solder and loses adhesion to the MCM substrate surface. This situation will be described with reference to FIG. 3.

Figure 3:
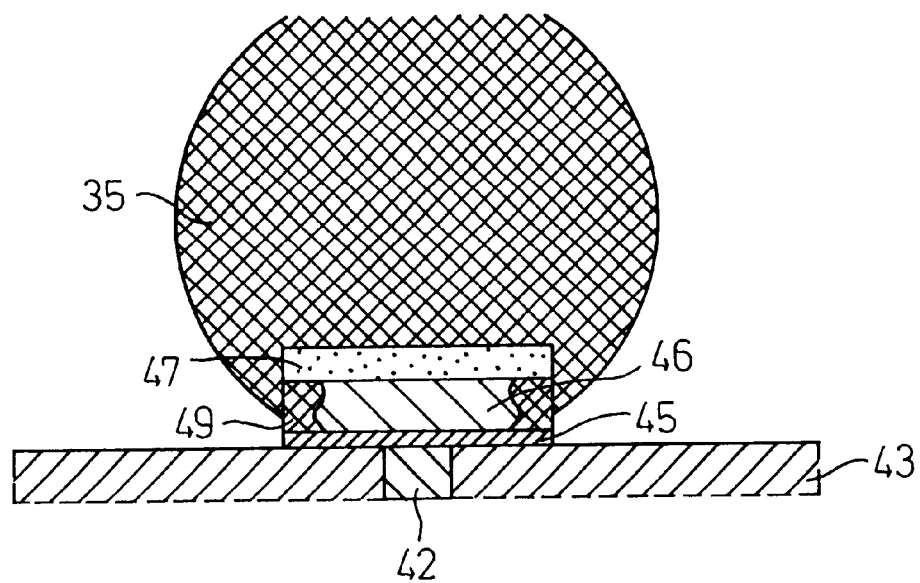
FIG. 3 is a diagram for explaining a problem associated with the prior art pad.

FIG. 3 is a schematic cross-sectional view for explaining the problem of the prior art pad. As shown, the solder bump 35 adheres also to the side faces of the pad, but since an Ni layer that can act as a barrier to the solder is not formed on the side faces of the pad, the Cu forming the Cu electroplated layer 46 diffuses into the solder pad 35, while on the other hand, the solder forming the solder bump 35 penetrates into the Cu electroplated layer 46, forming a solder eroded portion 49. Here, a Cu—Sn alloy, etc. formed in the solder eroded portion 49 has poor adhesion to the Cr thin film 45 and is mechanically brittle, so that the pad tends to be separated from the substrate surface.

Since the amount of such mutual diffusion depends on the temperature profile of solder joining, the selection of joining temperature, time, and other profiles that can minimize such diffusion and can provide reliable solder joints has been a major consideration, but even when the temperature profile, etc. are controlled optimally, there remains the problem that when the rework process involving component removal and remounting is performed a plurality of times repeatedly on the same pad, the diffusion proceeds toward the center of the pad, finally eroding the entire structure of the Cu electroplated layer 46 and causing the pad to be separated.

There is the further problem that since not only the pad at the replaced site, but the solder joints of the components mounted around it are also subjected to thermal stresses during the rework, the solder on them also melts and the diffusion proceeds, causing a similar problem to that occurring to the pad at the replaced site.

Therefore, in practice, a limit is imposed on the number of times that component replacement can be done, and when component replacement is done more than the specified number of times, the MCM has to be scrapped because the reliability of pad adhesion cannot be ensured.

For example, with increasing functionality of computers in recent years, there is an increasing demand for MCMs on which a large number of functional components such as LSIs are mounted, and with this trend, the need is rapidly growing to increase the number of times that LSIs can be replaced for such reasons as component repairs due to LSI connection failures or functional upgrades of LSIs. In the case of an MCM substrate on which 10 different LSIs are mounted, for example, thermal stresses may be applied as many times as there are LSIs, that is, a maximum of 10 times for component replacement for LSI functional upgrades, etc., and therefore, pads capable of withstanding such thermal stresses are needed.

In view of this situation, the inventor et al. attempted to improve the prior art pad in order to increase the restricted number of times that the rework can be done. The improved pad will be described below with reference to FIG. 4.

Figure 4:
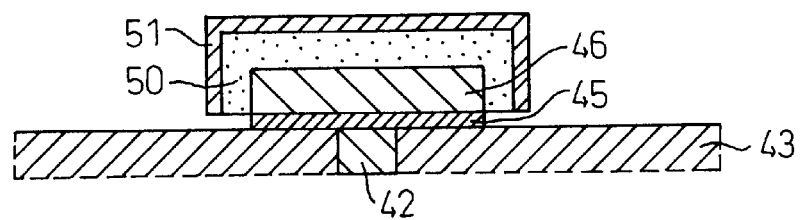
FIG. 4 is a schematic cross-sectional view of an improved pad according to the prior art.

FIG. 4 is a schematic cross-sectional view showing the improved prior art pad. As in the above-described prior art structure, the Cr thin film 45 with good adhesion to the polyimide layer 43 is formed up to a thickness of about 1000 Å in such a manner as to be connected to the uppermost Cu via 42 exposed in the polyimide layer 43, and after that, the Cu electroplated layer 46 as a main conductor is formed to a thickness of 1 $\mu$m to 5 $\mu$m, for example, 3 $\mu$m.

In this improved pad, however, a Ni electroplated layer 50 with a thickness of 1 $\mu$m to 3 $\mu$m, for example, 2 $\mu$m, and an Au electroplated layer 51 are formed one on top of the other in such a manner as to also cover the side faces of the Cu electroplated layer 46; in this structure, since the side faces of the Cu electroplated layer 46 are covered with the Ni electroplated layer 50 highly resistant to erosion by solder, the Cu electroplated layer 46 is prevented from diffusing into the solder.

Figure 5:
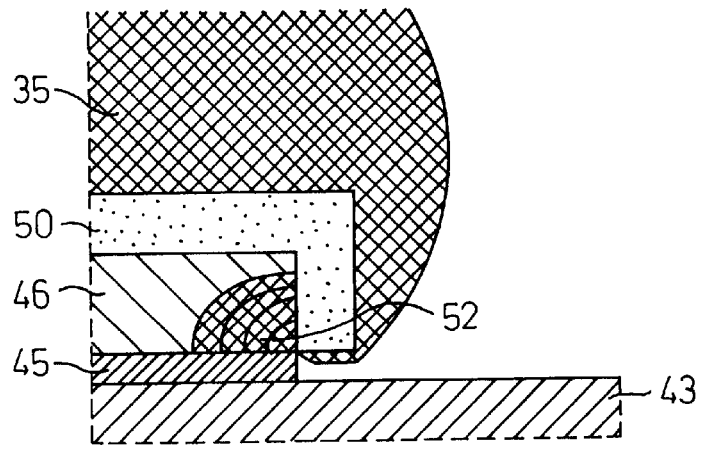
FIG. 5 is a diagram for explaining a problem associated with the prior art improved pad.

FIG. 5 is a diagram for explaining a problem associated with the prior art improved pad. As shown in FIG. 5, since the Ni electroplated layer 50 is not formed so as to intimately contact the Cr thin film 45, a microscopic gap is left at the interface between the Cr thin film 45 and the Cu electroplated layer 46 covered with the Ni electroplated layer 50; as a result, if stress associated with solder melting is applied many times, solder penetration occurs through the interface and a solder eroded portion 52 is formed. This also has the problem that the number of times that component replacement can be done is limited, and a perfect anti-solder erosion effect cannot be obtained.

Figure 6:
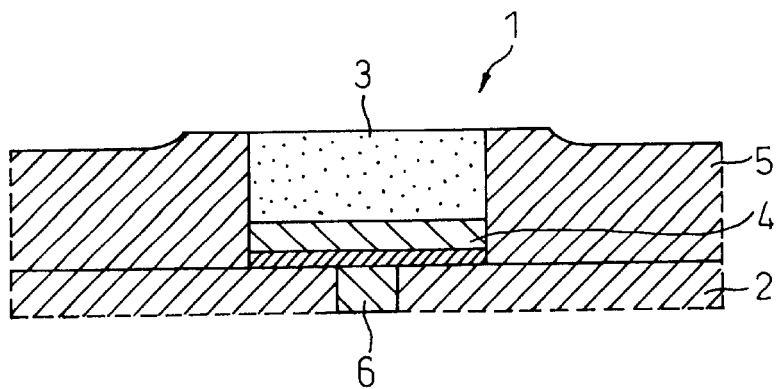
FIG. 6 is a diagram for explaining the basic structure of the present invention.

FIG. 6 is a schematic cross-sectional view of a pad, showing the basic structure of the present invention.

As shown in FIG. 6, the present invention is characterized in that, in a mounted circuit substrate 2 having at least one conductive layer, side faces of a component mounting pad 1 formed on a surface of the substrate, and including at least a columnar pattern 3 made of a metal highly resistant to erosion by solder, are completely covered with an organic insulating layer 5.

In this way, since the side faces of the component mounting pad 1 electrically connected to a conductive via 6 formed in the mounted circuit substrate 1 are covered with the organic insulating layer 5, all the portions forming the component mounting pad 1, except the portion where the columnar pattern 3 made of a metal highly resistant to erosion by solder is formed, are prevented from contacting solder. This prevents the pad from being separated due to erosion by solder, and thus allows component replacement, that is, component rework, to be done many times.

The invention is also characterized in that, in the above structure, the portion forming the component mounting pad 1 and lying below the columnar pattern 3 made of a metal highly resistant to erosion by solder is made larger in diameter than the columnar pattern 3.

In this way, since the portion forming the component mounting pad 1 and lying below the columnar pattern 3 made of a metal highly resistant to erosion by solder is made larger in diameter than the columnar pattern 3, that is, the component mount pad 1 is made inverted T-shaped in cross section, the larger diameter portion acts as a stopper for keeping the component mounting pad 1 in position for each mounted component and thus preventing the component mounting pad 1 from being separated.

The invention is also characterized in that, in the above structures, an Au layer is formed to cover an exposed top surface of the columnar pattern 3 made of a metal highly resistant to erosion by solder.

Since the Au layer formed on the exposed top surface serves to prevent the oxidation of the solder contacting surface of the columnar pattern 3 made of a metal highly resistant to erosion by solder and to provide a wettable surface for the solder, a reliable bond can be provided between the solder and the component mounting pad 1 and the reliability of the component mounted apparatus improves.

The Au layer here may be formed as an Au plated layer or as an Au layer deposited by sputtering.

Preferably, a plated layer made of a metal highly resistant to erosion by solder is formed between the Au layer and the top surface of the columnar pattern 3 made of a metal highly resistant to erosion by solder.

That is, by interposing the plated layer made of a metal highly resistant to erosion by solder, the bonding characteristic can be improved.

Preferably, the metal highly resistant to erosion by solder is Ni.

Also preferably, the metal highly resistant to erosion by solder is Pt.

That is, Pt may be used as the metal highly resistant to erosion by solder.

Preferably, the portion forming the component mounting pad 1 and lying below the columnar pattern 3 made of a metal highly resistant to erosion by solder includes at least a Cu base layer 4.

That is, since the columnar pattern 3 made of a metal highly resistant to erosion by solder is difficult to form directly by electroplating, it becomes important to provide the Cu base layer 4 as its base. The Cu base layer 4 is easily eroded by solder, as earlier described, but since its surface is covered by the metal highly resistant to erosion by solder and its side faces are covered with the organic insulating layer 5, the Cu base layer 4 does not contact the solder and, therefore, the component mounting pad 1 does not deteriorate.

Preferably, the organic insulating layer 5 is formed from a polyimide resin.

Though an epoxy resin or a polyimide fluoride resin can be used for the organic insulating layer 5 covering the side faces of the columnar pattern 3, it is preferable to use polyimide which is capable of forming a very thin dielectric layer by spin coating and which is the same material as the insulating material forming the underlying circuit layer.

Further preferably, the top surfaces of all the columnar patterns 3 made of a metal highly resistant to erosion by solder lie in the same plane.

That is, when all the component mounting pads 1 are made the same height on the substrate surface, greater allowance can be provided for the variation in the amount of solder forming the solder bumps on C4 connected LSIs, etc. and variations in the mounting height among the plurality of components can be controlled.

Further, the present invention also provides a method for fabricating a mounted circuit substrate, wherein after a component mounting pad 1 including at least a columnar pattern 3 made of a metal highly resistant to erosion by solder is formed on a thin-film multilayer substrate having at least one conductive layer, an organic insulating layer 5 is formed in such a manner as to cover the component mounting pad 1, and then the organic insulating layer 5 is removed over the entire surface thereof so as to provide a planarized surface until the top of the columnar pattern 3 made of a metal highly resistant to erosion by solder is exposed.

In this way, by forming the organic insulating layer 5 so as to cover the component mounting pad 1, and by removing the organic insulating layer 5 over the entire surface thereof so as to provide a planarized surface until the top of the columnar pattern 3 made of a metal highly resistant to erosion by solder is exposed, only the top surface of the component mounting pad 1 can be exposed while leaving its side faces completely covered for protection, and thus preventing the interior of the component mounting pad 1 from being eroded by solder.

The invention is also characterized in that, in the above method, after forming the columnar pattern 3 made of a metal highly resistant to erosion by solder, the portion forming the component mounting pad 1 and lying below the columnar pattern 3 made of a metal highly resistant to erosion by solder is etched so as to have a larger diameter than the diameter of the columnar pattern 3, thereby forming the component mounting pad 1.

In this way, after forming the columnar pattern 3 made of a metal highly resistant to erosion by solder, the columnar pattern 3 is covered with a resist pattern and, using this resist pattern as a mask, the lower portion of the component mounting pad 1 is etched so as to form the component mounting pad 1 inverted T-shaped in cross section, thus providing secure means for prevention of the pulling out of the component mounting pad 1.

Preferably, the step of removing the organic insulating layer 5 over the entire surface thereof so as to provide a planarized surface until the top of the columnar pattern 3 made of a metal highly resistant to erosion by solder is exposed, is performed using a method called Chemical Mechanical Polishing.

That is, by using the Chemical Mechanical Polishing (CMP) method and removing the organic insulating layer 5 over the entire surface thereof so as to provide a planarized surface, the variation in metal thickness due to nonuniformity of the current distribution on the substrate surface during plating can be corrected, and all the component mounting pads 1 can be made the same height on the substrate surface.

Also preferably, an Au layer is formed either by electroless plating or by sputtering on the exposed top surface of the columnar pattern 3 made of a metal highly resistant to erosion by solder.

That is, by forming the Au layer on the exposed top surface of the component mounting pad 1, the oxidation of the exposed top surface of the component mounting pad 1 can be prevented, while providing solder wettability Further preferably, after a plated layer made of a metal highly resistant to erosion by solder is formed by electroless plating, an Au layer is formed either by electroless plating or by sputtering on the exposed top surface of the columnar pattern 3 made of a metal highly resistant to erosion by solder.

That is, by interposing the plated layer made of a metal highly resistant to erosion by solder, the bonding characteristic can be improved.

Preferably, the metal highly resistant to erosion by solder is Ni.

That is, as an inexpensive metal that is highly resistant to erosion by solder, and that is capable of forming a thick film by plating, Ni is, most preferable.

More preferably, the metal highly resistant to erosion by solder is Pt.

That is, Pt may be used as the metal highly resistant to erosion by solder.

Preferably, the portion forming the component mounting pad 1 and lying below the columnar pattern 3 made of a metal highly resistant to erosion by solder includes at least a Cu base layer 4.

That is, since the columnar pattern 3 made of a metal highly resistant to erosion by solder is difficult to form directly by electroplating, it becomes important to provide the Cu base layer 4 as its base.

Also preferably, the organic insulating layer 5 is formed from a polyimide resin.

Though an epoxy resin or a polyimide fluoride resin can be used for the organic insulating layer 5 covering the side faces of the columnar pattern 3, it is preferable to use polyimide which is capable of forming a very thin dielectric layer by spin coating and which is the same material as the insulating material forming the underlying circuit layer.

Further preferably, prior to the formation of the applied to the side faces of the columnar pattern 3 made of a metal highly resistant to erosion by solder.

That is, by applying a coupling agent, for example, an amino silane coupling agent, the adhesion between the columnar pattern 3 and the organic insulating layer 5 can be increased.

A fabrication process according to a first embodiment of the present invention will be described below with reference to FIGS. 7A to 7I.

Each diagram presents a schematic cross-sectional view of a pad.

Figure 7A:
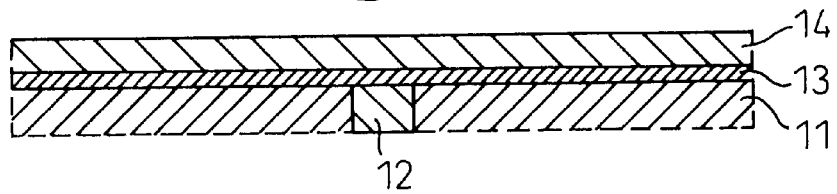
FIGS. 7A to 7I are diagrams for explaining a fabrication process according to a first embodiment of the present invention.

First, as shown in FIG. 7A, a Cr thin film 13 with a maximum thickness of 1000 Å, for example, 800 Å, and a Cu base layer 14 with a thickness of 1 µm to 3 µm, for example, 2 µm, are deposited one on top of the other by sputtering in such a manner as to be connected to the uppermost Cu via 12 exposed through a polyimide layer 11 which forms part of a multi-layer thin film circuit substrate D part.

Figure 7B:
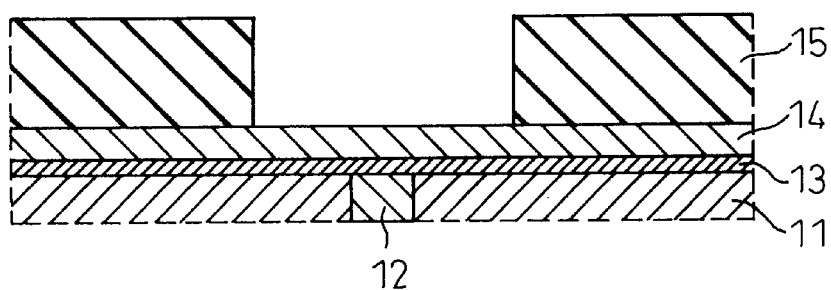

Next, as shown in FIG. 7B, a resist is applied over the Cu base layer 14, then the resist is exposed and developed to form a resist pattern 15 having an opening area corresponding to the size of the pad.

Figure 7C:
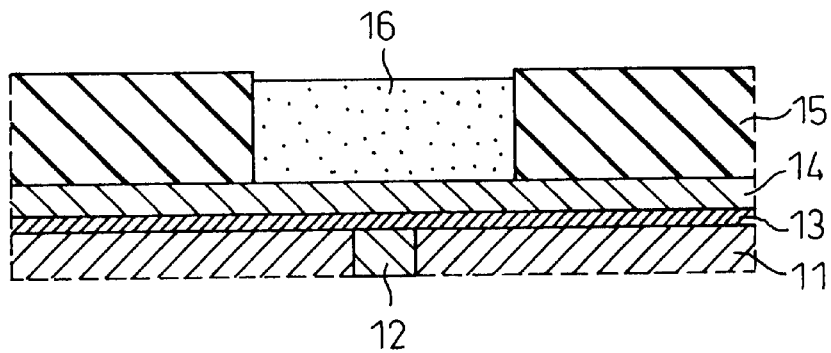

Next, as shown in FIG. 7C, using an electroplating method, a columnar Ni electroplated pad 16 is formed to a thickness of 6 µm to 8 µm, for example, 6 µm, by making the Cu base layer 14 the current distribution layer and the substituting metal.

Figure 7D:
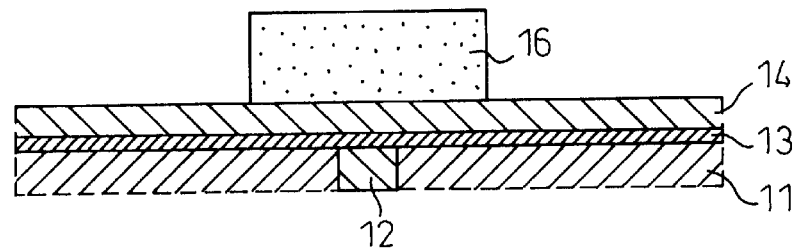

Next, as shown in FIG. 7D, the resist pattern 15 is removed.

Figure 7E:
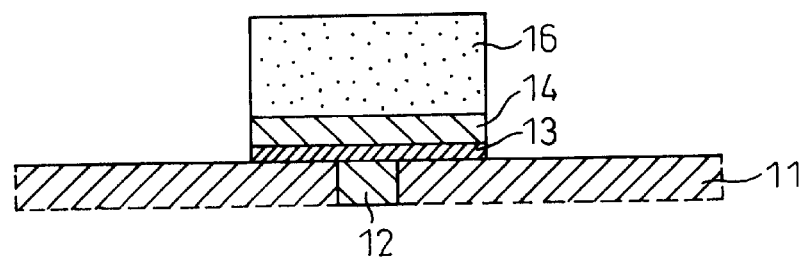

Next, as shown in FIG. 7E, using the columnar Ni electroplated pad 16 as a mask, the exposed portions of the Cu base layer 14 and Cr thin film 13 are removed by wet etching.

Figure 7F:
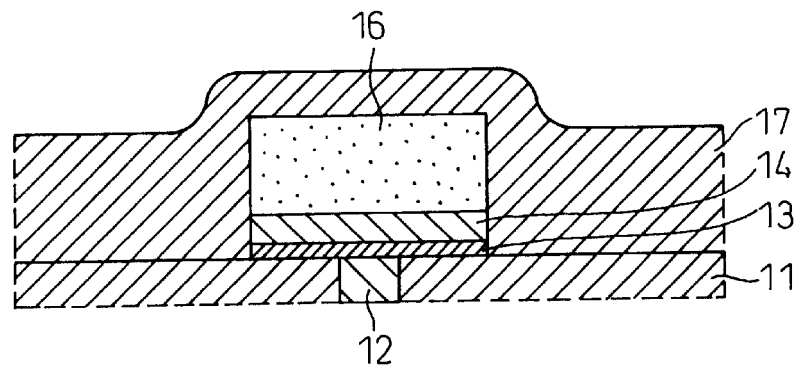

Next, as shown in FIG. 7F, after applying an amino silane coupling agent, for example, VM651 (trade name of DuPont), over the entire surface and thereby improving adhesion to polyimide-used to coat the Ni electroplated pad 16, a polyimide resin, for example, PI2611 (trade name of DuPont), is applied over the entire surface by spin coating to form a polyimide embedding layer 17 whose planar portion is, for example, 5 µm in thickness.

Figure 7G:
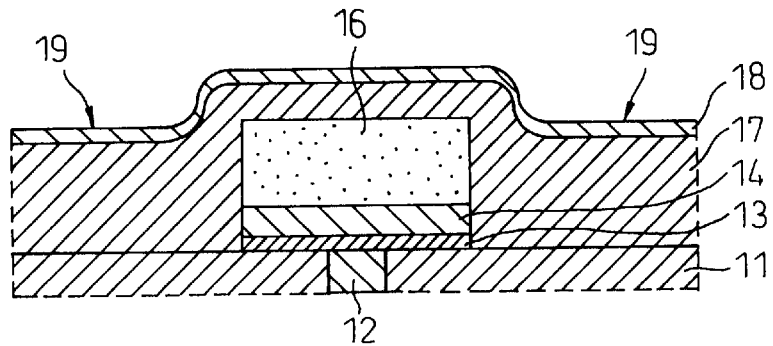

Next, as shown in FIG. 7G, a tungsten (W) film 18 with a maximum thickness of several thousand angstroms, for example, 3000 Å, is deposited by sputtering over the entire surface.

Figure 7H:
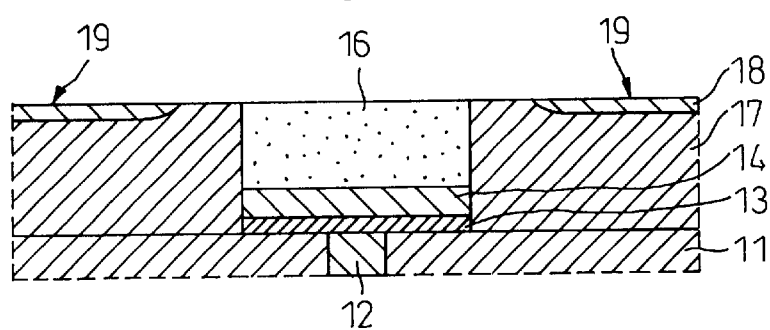

Next, as shown in FIG. 7H, using the CMP method, the entire surface of the polyimide embedding layer 17 and Ni electroplated pad 16 is polished to a smooth surface, forming the Ni electroplated pad 16 surrounded by the planarized polyimide embedding layer 17.

In the CMP process, the W film planar portion 19 forming the largest area portion deposited on the planar portion of the polyimide embedding layer 17 acts as a stopper so that the polishing stops at the height of the W film planar portion 19; therefore, if there are variations in thickness among deposited Ni electroplated pads 16 due to nonuniformity of the current distribution on the substrate surface during plating, all the Ni electroplated pads.16 on the substrate surface can be made the same height by the CMP process.

Figure 7I:
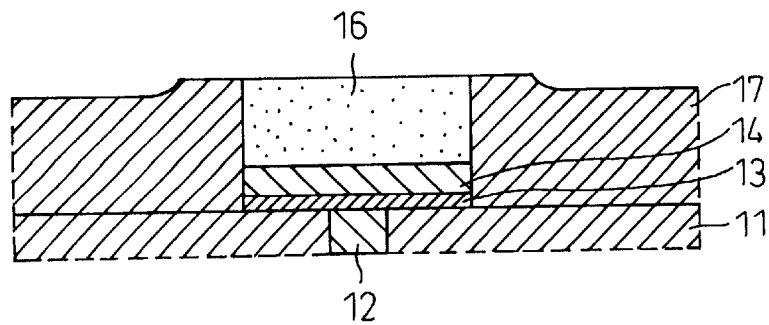

Finally, as shown in FIG. 7I, by removing the W film planar portion 19 by wet etching, the basic structure of the component mounting pad is completed.

When mounting a component on this component mounting pad, since the top surface of the Ni electroplated pad 16 is oxidized and solder wettability is degraded, either flux is applied to the surface prior to the joining process or joining is performed in a mixed atmosphere of $H_2$ and $N_2$ that has a deoxidizing effect.

As described above, in the first embodiment of the present invention, since all the side faces of the component mounting pad is covered with the polyimide embedding layer 17, the Cu base layer 14 which tends to be eroded by solder is prevented from contacting the solder; as a result, the pad can survive component replacement many times, that is, the solder stresses associated with the rework process performed many times.

Furthermore, since the CMP method is used to expose the top surface of each Ni electroplated pad 16, all the Ni electroplated pads can be made the same height; as a result, greater allowance can be provided for the variation in the amount of solder used in the solder bumps on C4 connected LSIs, etc. and variations in the mounting height among the plurality of components can be controlled.

In a prior art printed wiring board, it is proposed that the side faces of each component surface mounting land formed from a Cu plated layer for mounting a functional component thereon be covered with a photosensitive insulating resin and its surface be removed by buffing in order to prevent the separation of the component surface mounting land (refer, if necessary, to Japanese Unexamined Patent Publication (Kokai)No. 9-219588).

However, this prior art after all concerns printed wiring boards and, moreover, the component surface mounting land is formed from Cu that is easily eroded by solder, and the Cu layer thickness and wiring line width are totally different from those for MCMs. This prior art therefore does not provide any useful information for the formation of pads for MCMs.

Note that, in the above description, the via (contact hole) is formed by the Cu via 12, however, it can be considered that the via is formed by the Cu via 12, the Ni electroplated pad 16, the Cu base layer 14, and Cr thin film 13.

Next, a fabrication process according to a second embodiment of the present invention will be described with reference to FIGS. 8A to 8C.

Figure 8A:
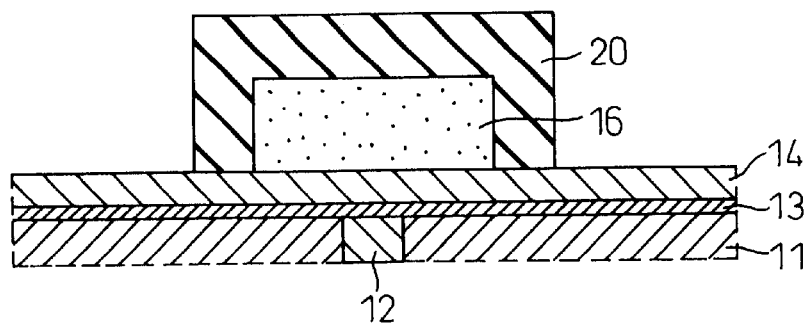
FIGS. 8A to 8C are diagrams for explaining a fabrication process according to a second embodiment of the present invention.

First, as shown in FIG. 8A, the columnar Ni electroplated pad 16 is formed by following exactly the same fabrication steps up to FIG. 7D in the first embodiment; after that, a resist is applied over the entire surface, and the resist is exposed and developed to form a resist pattern 20 having outer dimensions larger than those of the Ni electroplated pad 16.

Figure 8B:
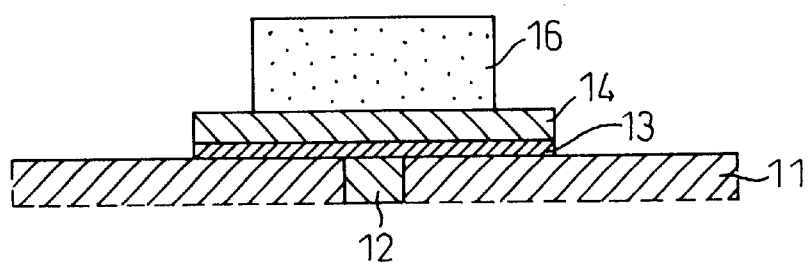

Next, as shown in FIG. 8B, using the resist pattern 20 as a mask, wet etching is applied to remove the exposed portions of the Cu base layer 14 and Cr thin film 13, thereby forming a component mounting pad having an inverted T-shaped cross section. After that, the resist pattern 20 is removed.

Figure 8C:
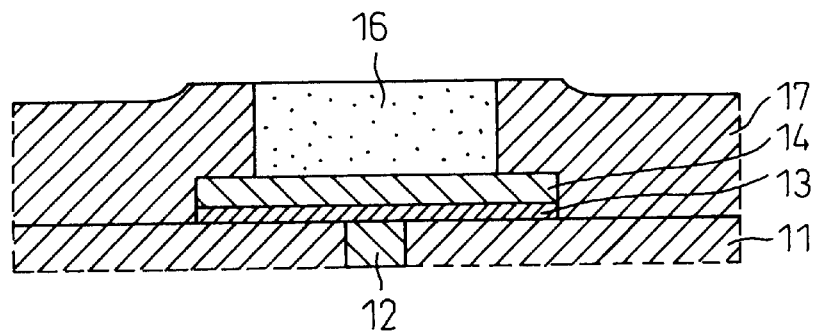

As shown in FIG. 8C, the remainder of the fabrication steps are exactly the same as those shown in FIGS. 7F to 7I in the first embodiment. That is, after applying an amino silane coupling agent, the polyimide embedding layer 17 and the W film are formed; then, the polyimide embedding layer 17 is planarized by the CMP method, the top surface of the Ni electroplated pad 16 is exposed, and the W film planar portion is removed, to complete the basic structure of the component mounting pad according to the second embodiment.

In the second embodiment of the present invention, since the component mounting pad has an inverted T-shaped cross section, the Cu base layer 14 having the larger diameter acts as a stopper for keeping the component mounting pad in position and thus preventing it from being separated.

Other effects and advantages are the same as those of the first embodiment.

Next, a third embodiment of the present invention will be described with reference to FIG. 9.

FIG. 9 is a schematic cross-sectional view showing the third embodiment of the present invention. In this embodiment, after forming the basic structure of the component mounting pad shown in FIG. 7I in the first embodiment, an electroless Au plated layer 21 with a maximum thickness of 1 μm, for example, 0.3 μm, is formed by electroless plating on the exposed surface of the Ni electroplated pad 16.

In this way, in the third embodiment of the present invention, since the surface of the Ni electroplated pad 16 susceptible to oxidation is covered with the electroless Au plated layer 21, oxidation of the surface of the Ni electroplated pad 16 can be prevented, while at the same time, providing solder wettability.

Next, a modified example of the third embodiment of the present invention will be described with reference to FIG. 10.

FIG. 10 is a schematic cross-sectional view showing the modified example of the third embodiment of the present invention. In this example, after forming the basic structure of the component mounting pad shown in FIG. 7I in the first embodiment, the oxide film on the exposed surface of the Ni electroplated pad 16 is chemically removed, then an electroless Ni plated layer 22 with a maximum thickness of 3 μm, for example, 2.0 μm, is formed by electroless plating, and immediately after that, an electroless Au plated layer 21 with a maximum thickness of 1 μm, for example, 0.3 μm, is formed by electroless plating.

Next, a fourth embodiment of the present invention will be described with reference to FIG. 11.

Figure 11:
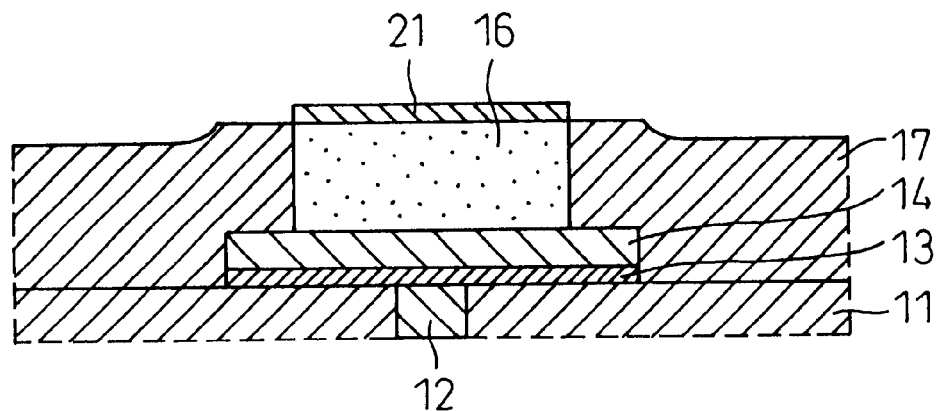
FIG. 11 is as schematic cross-sectional view showing a fourth embodiment of the present invention.

FIG. 11 is a schematic cross-sectional view showing the fourth embodiment of the present invention. In this embodiment, after forming the basic structure of the component mounting pad shown in FIG. 8C in the second embodiment, an electroless Au plated layer 21 with a maximum thickness of 1 μm, for example, 0.3 μm, is formed by electroless plating on the exposed surface of the Ni electroplated pad 16.

In this way, in the fourth embodiment of the present invention, as in the foregoing third embodiment, since the surface of the Ni electroplated pad 16 susceptible to oxidation is covered with the electroless Au plated layer 21, oxidation of the surface of the Ni electroplated pad 16 can be prevented, while at the same time, providing solder wettability.

Next, a modified example of the fourth embodiment of the present invention will be described with reference to FIG. 12.

Figure 12:
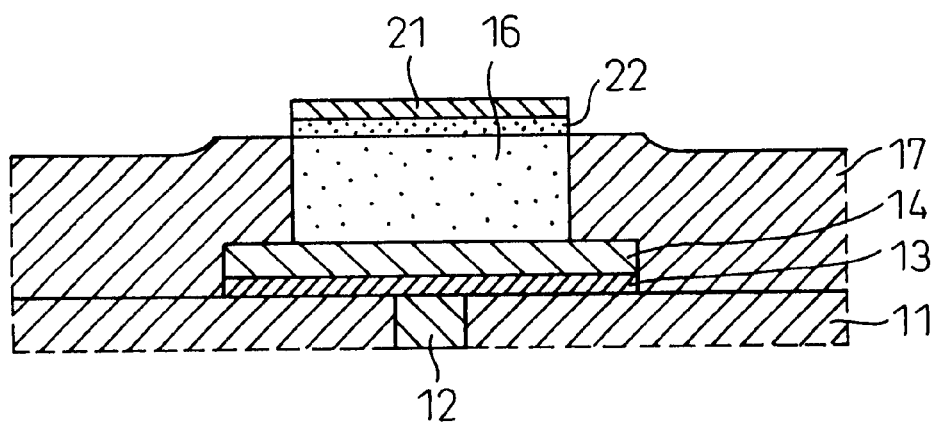
FIG. 12 is a schematic cross-sectional view showing a modified example of the fourth embodiment of the present invention.

FIG. 12 is a schematic cross-sectional view showing the modified example of the fourth embodiment of the present invention. In this example, after forming the basic structure of the component mounting pad shown in FIG. 8C in the second embodiment, the oxide film on the exposed surface of the Ni electroplated pad 16 is chemically removed, then an electroless Ni plated layer 22 with a maximum thickness of 3 μm, for example, 2.0 μm, is formed by electroless plating, and immediately after that, an electroless Au plated layer 21 with a maximum thickness of 1 μm, for example, 0.3 μm, is formed by electroless plating.

Specific embodiments of the present invention have been described above, but the invention is not limited to the structures and conditions described in the embodiments disclosed herein and various modifications are possible.

For example, in each of the above embodiments of the invention, the columnar pattern forming the main part of the component mounting pad is formed from an Ni electroplated layer, but the material need not necessarily be limited to Ni; instead, Pt (platinum) having as excellent resistance to solder erosion as Ni may be used.

Further, in each of the above embodiments, polyimide is used to form the insulating layer for embedding the columnar pattern, but the material is not limited to polyimide; for example, other organic insulating layer such as an epoxy layer or a polyimide fluoride layer may be used.

In each of the above embodiments, an amino silane coupling agent is applied before coating with polyimide, but the coupling agent need not necessarily be limited to the amino silane coupling agent; further, if the coating resin contains a coupling agent, the step of applying the coupling agent is not needed.

In each of the above embodiments, tungsten (W) is used to form the film that acts as a stopper in the CMP process, but the material is not limited to W; the only requirement here is that the film be a metal film harder than the Ni electroplated pad to be polished, and even an insulating film may be used.

In the third and fourth embodiments, the Au layer is formed by electroless plating, but the method is not limited to electroless plating; for example, sputtering techniques may be used for the formation of the Au film.

According to the present invention, since the side faces of the component mounting pad are covered with an organic insulating layer such as a polyimide layer, if the component mounting pad contains a portion that tends to be eroded by solder, such a portion is prevented from contacting the solder; as a result, the pad can survive repeated reworks, and thus the life of the MCM substrate can be extended. This greatly contributes to reducing the costs of electronic apparatuses using MCM substrates.

Furthermore, in the present invention, since the surface of each component mounting pad is exposed using the CMP method, variations in height among the component mounting pads on the substrate surface can be eliminated, which provides greater allowance for the variation in the amount of solder used in the solder pads formed on the component side and thus serves to reduce the variation in the mounting height among the components mounted on the substrate. As a result, mounting accuracy in the component mounting process can be relaxed.

Many different embodiments of the present invention may be constructed without departing from the spirit and scope of the present invention, and it should be understood that the present invention is not limited to the specific embodiments described in this specification, except as defined in the appended claims.

What is claimed is:

1. A mounted circuit substrate comprising:
   at least one conductive layer;
   a component mounting pad formed on a surface of said substrate, the component mounting pad including at least a columnar pattern made of a metal highly resistant to erosion by solder; and
   an organic insulating layer, formed from a polyimide resin, completely covering side faces of the component mounting pad.

2. The mounted circuit substrate as claimed in claim 1, wherein said component mounting pad further includes a portion lying below said columnar pattern, said portion being made larger in diameter than the columnar pattern.

3. The mounted circuit substrate as claimed in claim 1, wherein an Au layer is formed to cover an exposed top surface of said columnar pattern.

4. The mounted circuit substrate as claimed in claim 3, wherein said Au layer is a plated layer.

5. The mounted circuit substrate as claimed in claim 3, wherein said Au layer is an Au layer deposited by sputtering.

6. The mounted circuit substrate as claimed in claim 3, further comprising a plated layer made of said metal highly resistant to erosion by solder which is formed between said Au layer and the top surface of said columnar pattern.

7. The mounted circuit substrate as claimed in claim 1, wherein the metal highly resistant to erosion by solder is Ni or Pt.

8. The mounted circuit substrate as claimed in claim 1, wherein said component mounting pad further includes a portion lying below said columnar pattern, the portion including at least a Cu base layer.

9. The mounted circuit substrate as claimed in claim 1, further comprising a plurality of columnar patterns, wherein all top surfaces of said columnar patterns lie in the same plane.

10. The mounted circuit substrate as claimed in claim 3, further comprising a plated layer made of another metal highly resistant to erosion by solder which is formed between said Au layer and the top surface of said columnar pattern.

* * * * *